United States Patent
Lin et al.

(10) Patent No.: US 9,275,877 B2
(45) Date of Patent: Mar. 1, 2016

(54) SEMICONDUCTOR DEVICE AND METHOD OF FORMING SEMICONDUCTOR PACKAGE USING PANEL FORM CARRIER

(75) Inventors: Yaojian Lin, Singapore (SG); Rui Huang, Singapore (SG); Heap Hoe Kuan, Singapore (SG); Seng Guan Chow, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 211 days.

(21) Appl. No.: 13/236,952

(22) Filed: Sep. 20, 2011

(65) Prior Publication Data
US 2013/0069241 A1 Mar. 21, 2013

(51) Int. Cl.
*H01L 21/60* (2006.01)
*H01L 21/56* (2006.01)
(Continued)

(52) U.S. Cl.
CPC .......... *H01L 21/561* (2013.01); *H01L 21/6835* (2013.01); *H01L 23/3135* (2013.01); *H01L 23/49816* (2013.01); *H01L 24/97* (2013.01); *H01L 23/3128* (2013.01); *H01L 23/562* (2013.01); *H01L 24/16* (2013.01); *H01L 24/32* (2013.01); *H01L 24/48* (2013.01); *H01L 24/83* (2013.01); *H01L 24/85* (2013.01); *H01L 2221/68345* (2013.01); *H01L 2224/16225* (2013.01); *H01L 2224/16227* (2013.01); *H01L 2224/2919* (2013.01); *H01L 2224/32145* (2013.01); *H01L 2224/32225* (2013.01); *H01L 2224/48091* (2013.01); *H01L 2224/48227* (2013.01); *H01L 2224/48237* (2013.01); *H01L 2224/73265* (2013.01); *H01L 2224/82385* (2013.01); *H01L 2224/83005* (2013.01); *H01L 2224/83191* (2013.01); *H01L 2224/97* (2013.01); *H01L 2924/01029* (2013.01); *H01L 2924/01322* (2013.01); *H01L 2924/12041* (2013.01);
(Continued)

(58) Field of Classification Search
CPC ................... H01L 2224/83; H01L 2224/32225
USPC .......................... 438/127, 106, 107; 257/693
See application file for complete search history.

(56) References Cited

U.S. PATENT DOCUMENTS 6,884,652 B2 4/2005 Huang et al.
7,271,493 B2 9/2007 Huang et al.
(Continued)

FOREIGN PATENT DOCUMENTS

CN 101814481 A 8/2010
CN 101814482 A 8/2010

*Primary Examiner* — Caleb Henry
*Assistant Examiner* — Mounir Amer
(74) *Attorney, Agent, or Firm* — Robert D. Atkins; Patent Law Group: Atkins and Associates, P.C.

(57) ABSTRACT

A semiconductor device has a first insulating layer formed over a carrier. A first conductive layer is formed over the first insulating layer. A second insulating layer is formed over the first conductive layer. Vias are formed through the second insulating layer. A second conductive layer is formed over the second insulating layer and extends into the vias. A semiconductor die is mounted to the second conductive layer. A bond wire is formed between a contact pad on the semiconductor die and the second conductive layer. The second conductive layer extends to a mounting site of the semiconductor die to minimize the bond wire span. An encapsulant is deposited over the semiconductor die. A portion of the first insulating layer is removed to expose the second conductive layer. A portion of the first conductive layer is removed to electrically isolate remaining portions of the first conductive layer.

25 Claims, 15 Drawing Sheets

(51) Int. Cl.
  *H01L 23/48* (2006.01)
  *H01L 23/00* (2006.01)
  *H01L 23/498* (2006.01)
  *H01L 21/683* (2006.01)
  *H01L 23/31* (2006.01)

(52) U.S. Cl.
  CPC .......... *H01L2924/1306* (2013.01); *H01L 2924/13091* (2013.01); *H01L 2924/15311* (2013.01); *H01L 2924/181* (2013.01); *H01L 2924/18161* (2013.01); *H01L 2924/19105* (2013.01); *H01L 2924/3511* (2013.01)

(56) References Cited

U.S. PATENT DOCUMENTS

| | | | |
|---|---|---|---|
| 7,342,318 B2 | 3/2008 | Huang et al. | |
| 7,354,796 B2 | 4/2008 | Huang et al. | |
| 7,423,340 B2 | 9/2008 | Huang et al. | |
| 7,638,879 B2 | 12/2009 | Jiang et al. | |
| 7,795,071 B2 | 9/2010 | Hwee-Seng et al. | |
| 7,816,187 B2 | 10/2010 | Huang et al. | |
| 7,944,043 B1* | 5/2011 | Chung et al. | 257/698 |
| 2004/0171190 A1* | 9/2004 | Nishitani et al. | 438/106 |
| 2005/0184368 A1 | 8/2005 | Huang et al. | |
| 2005/0194665 A1 | 9/2005 | Huang et al. | |
| 2008/0108182 A1 | 5/2008 | Huang et al. | |
| 2008/0308951 A1 | 12/2008 | Li et al. | |
| 2009/0102043 A1 | 4/2009 | Jimmy et al. | |
| 2009/0102063 A1 | 4/2009 | Lee et al. | |
| 2009/0140442 A1* | 6/2009 | Lin | 257/778 |
| 2009/0291530 A1 | 11/2009 | Jimmy et al. | |
| 2009/0298228 A1* | 12/2009 | Sato et al. | 438/108 |
| 2010/0038771 A1 | 2/2010 | Shim et al. | |
| 2010/0052146 A1* | 3/2010 | Jiang et al. | 257/690 |
| 2010/0133527 A1* | 6/2010 | Lin et al. | 257/43 |
| 2010/0140780 A1* | 6/2010 | Huang et al. | 257/690 |
| 2010/0148360 A1* | 6/2010 | Lin et al. | 257/737 |
| 2010/0224971 A1 | 9/2010 | Li | |
| 2010/0264526 A1 | 10/2010 | Jimmy et al. | |
| 2010/0314728 A1 | 12/2010 | Li | |
| 2010/0314747 A1* | 12/2010 | Low et al. | 257/693 |
| 2011/0048773 A1* | 3/2011 | Kaneko et al. | 174/257 |

* cited by examiner

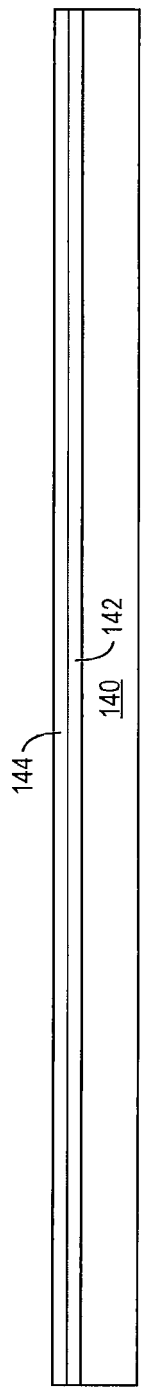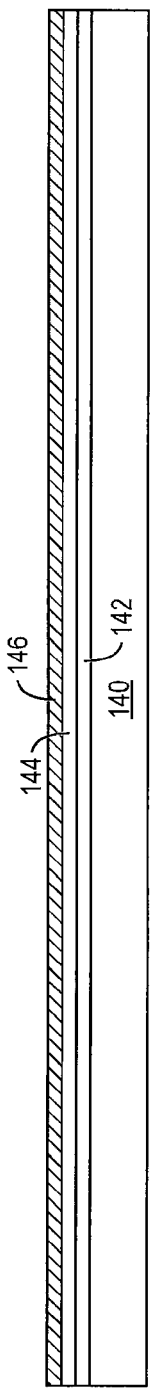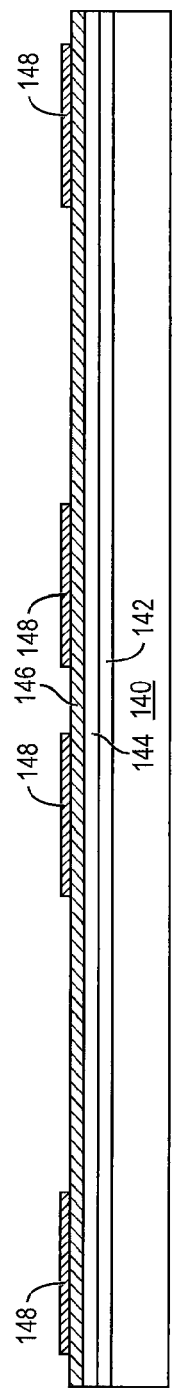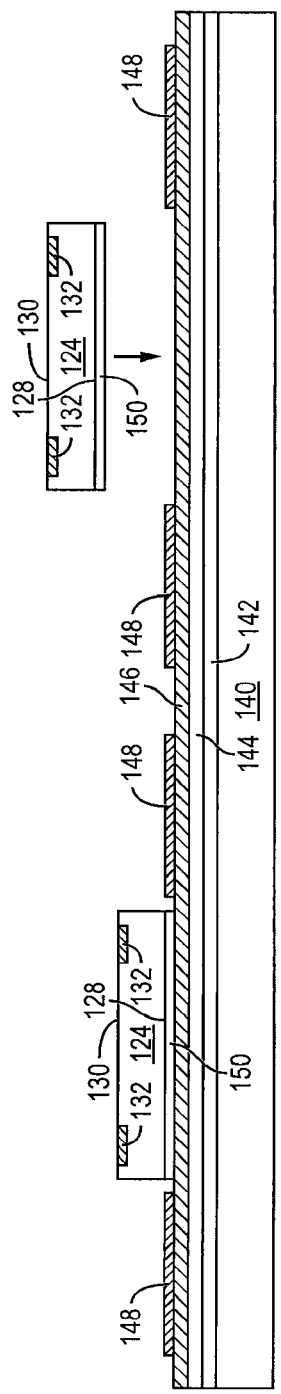

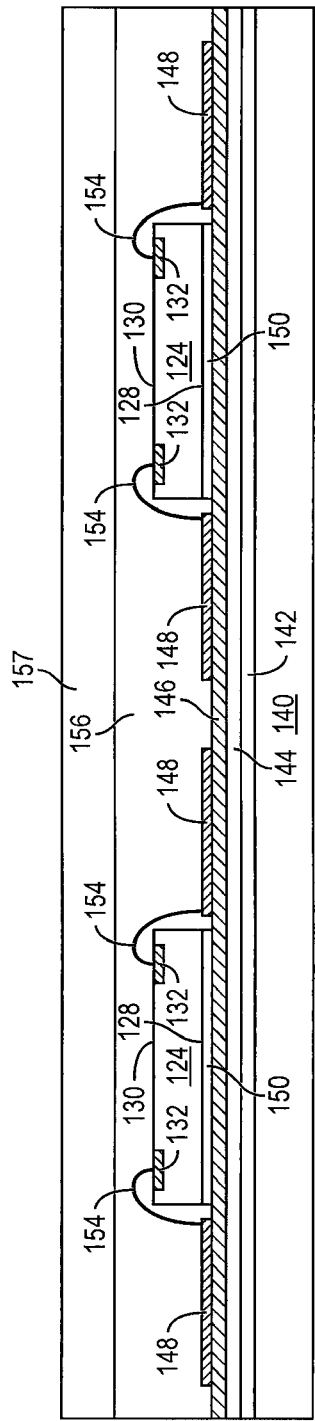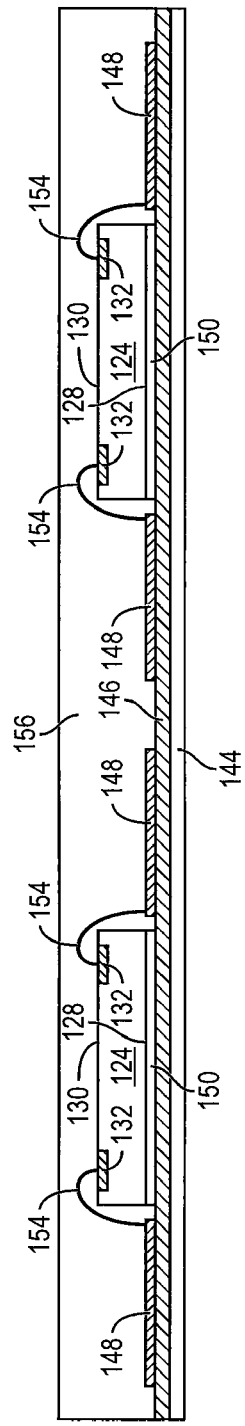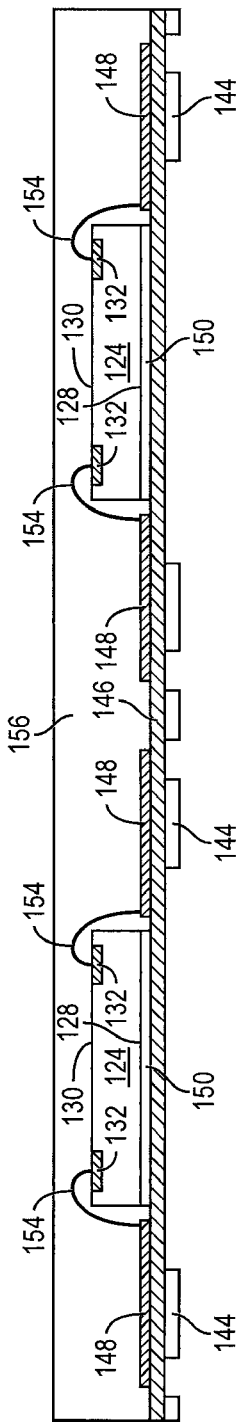

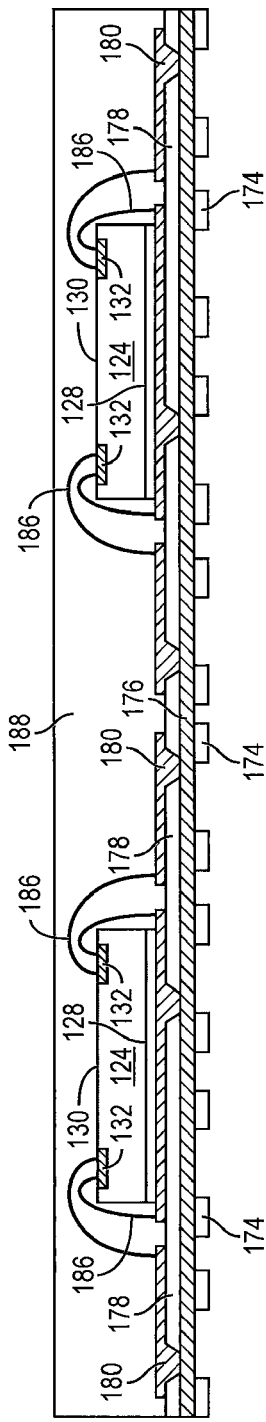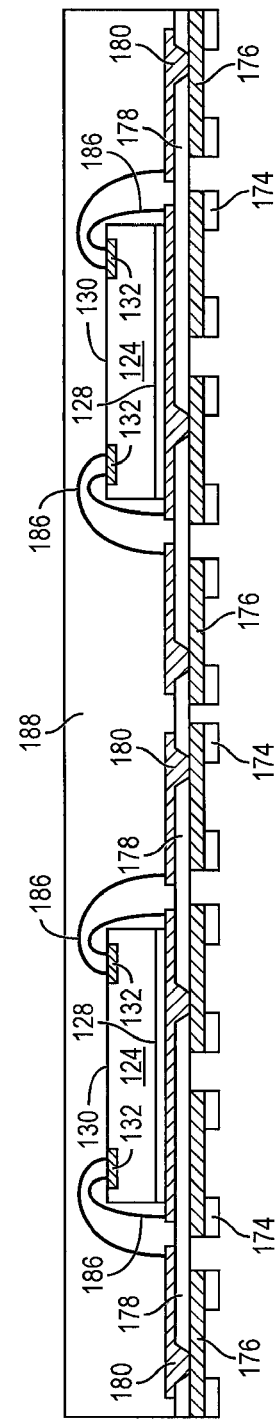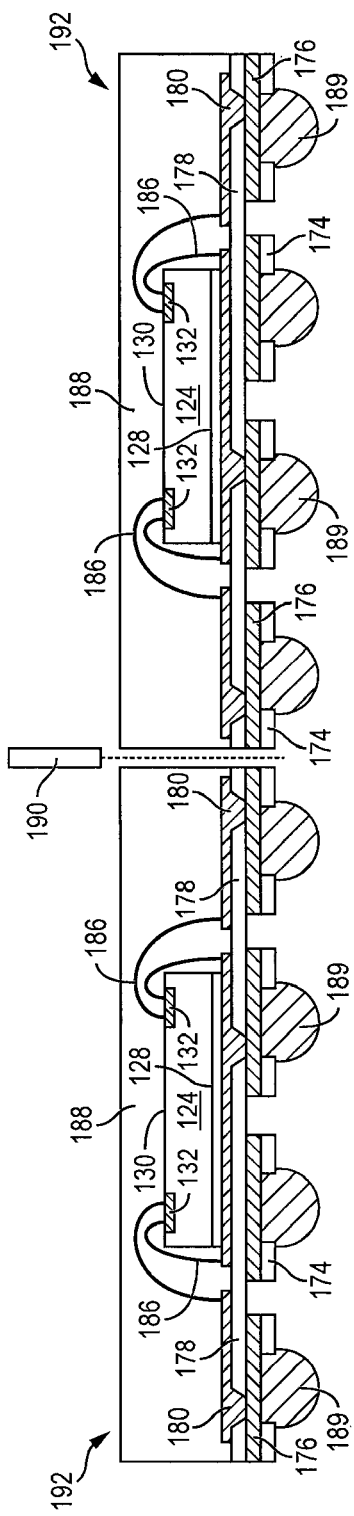
FIG. 6h
FIG. 6i
FIG. 6j

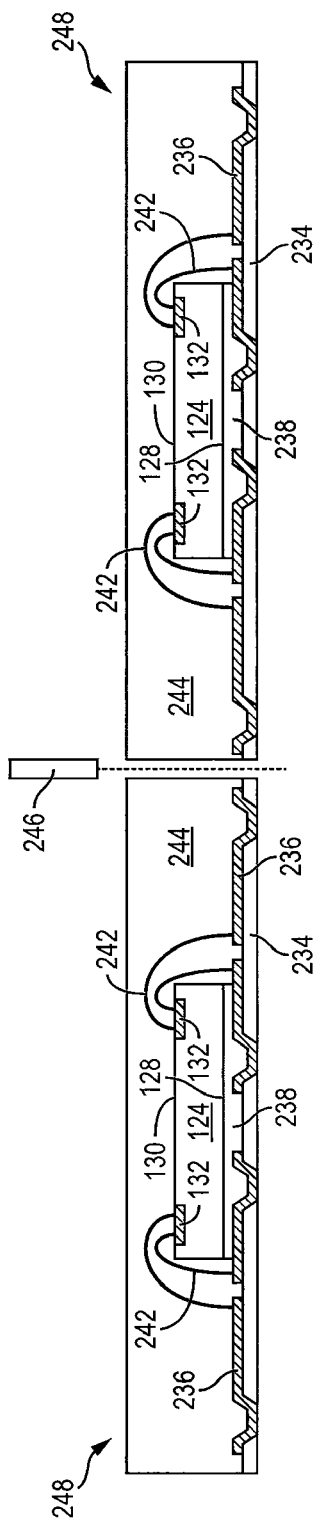
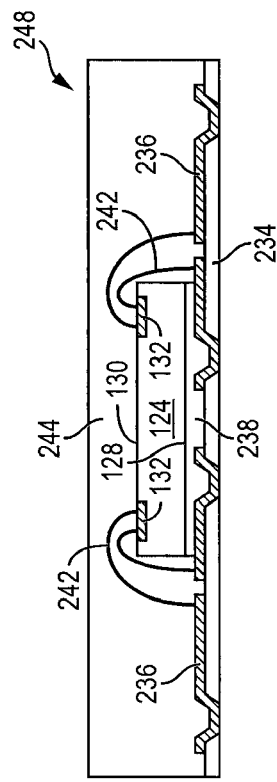

SEMICONDUCTOR DEVICE AND METHOD OF FORMING SEMICONDUCTOR PACKAGE USING PANEL FORM CARRIER

FIELD OF THE INVENTION

The present invention relates in general to semiconductor devices and, more particularly, to a semiconductor device and method of forming a semiconductor package using a panel form carrier.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

A conventional semiconductor package may contain a semiconductor die with bumps formed over contact pads on an active surface of the die. The semiconductor die is mounted to a substrate and covered with an encapsulant. Conductive vias or pillars are formed through the encapsulant around the substrate for vertical electrical interconnect. However, the formation of conductive vias may involve a time-consuming plating process and is susceptible to voids and other defects. The defects reduce manufacturing yield and increase cost.

SUMMARY OF THE INVENTION

A need exists for a simple and cost effective vertical electrical interconnect of a semiconductor die, particularly for leadframe ball array packages, such as QFNst or QFNmr. Accordingly, in one embodiment, the present invention is a method of making a semiconductor device comprising the steps of providing a carrier, forming an insulating layer over the carrier, forming a first conductive layer over the insulating layer, forming a second conductive layer over the first conductive layer, mounting a first semiconductor die to the first conductive layer, forming a bond wire between a contact pad on the first semiconductor die and the second conductive layer, depositing a first encapsulant over the first semiconductor die and carrier, removing the carrier, removing a portion of the insulating layer to expose the second conductive layer, and removing a portion of the first conductive layer to electrically isolate remaining portions of the first conductive layer.

In another embodiment, the present invention is a method of making a semiconductor device comprising the steps of forming a first insulating layer, forming a first conductive layer over the first insulating layer, forming a second conductive layer over the first insulating layer, mounting a first semiconductor die to the second conductive layer, forming a first bond wire between a contact pad on the first semiconductor die and the second conductive layer, depositing an encapsulant over the first semiconductor die, removing a portion of the first insulating layer to expose the second conductive layer, and removing a portion of the first conductive layer to electrically isolate remaining portions of the first conductive layer.

In another embodiment, the present invention is a method of making a semiconductor device comprising the steps of forming an insulating layer, forming a plurality of vias through the insulating layer, forming a conductive layer over the insulating layer and extending into the vias, mounting a first semiconductor die to the conductive layer with contact pads of the first semiconductor die electrically connected to the conductive layer, and depositing a first encapsulant over the first semiconductor die.

In another embodiment, the present invention is a semiconductor device comprising an insulating layer having a plurality of vias formed through the insulating layer. A conductive layer is formed over the insulating layer and extending into the vias. A first semiconductor die is mounted to the conductive layer with contact pads of the first semiconductor die electrically connected to the conductive layer. A first encapsulant is deposited over the first semiconductor die.

BRIEF DESCRIPTION OF THE DRAWINGS

FIGS. 4a-4l illustrate a process of forming a semiconductor package with a conductive layer extending to a die mounting site to minimize bond wire span;

FIGS. 6a-6j illustrate another process of forming a semiconductor package with a conductive layer extending to a die mounting site to minimize bond wire span;

FIGS. 10a-10h illustrate another process of forming a semiconductor package with a conductive layer extending to the die mounting site to minimize bond wire span;

FIG. 11 illustrates the semiconductor package with the conductive layer extending to the die mounting site to minimize bond wire span according to FIGS. 10a-10h;

DETAILED DESCRIPTION OF THE DRAWINGS

Figure 1:
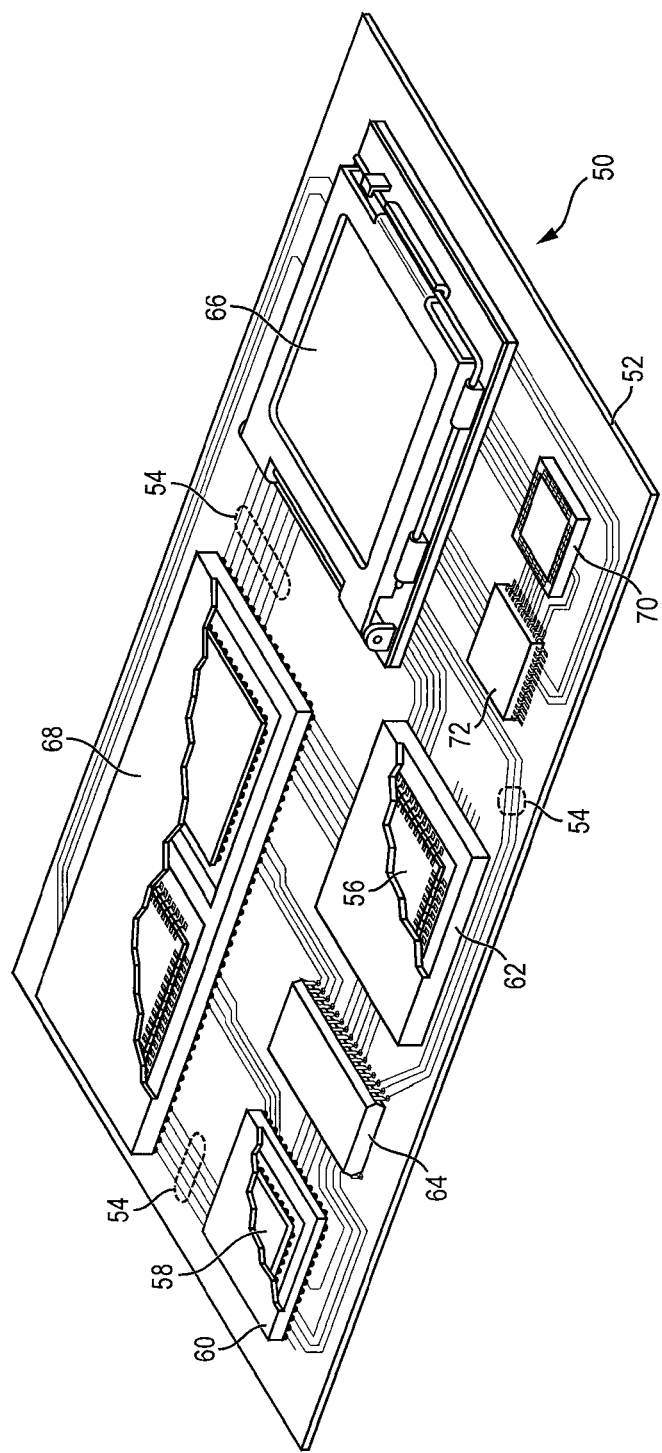
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
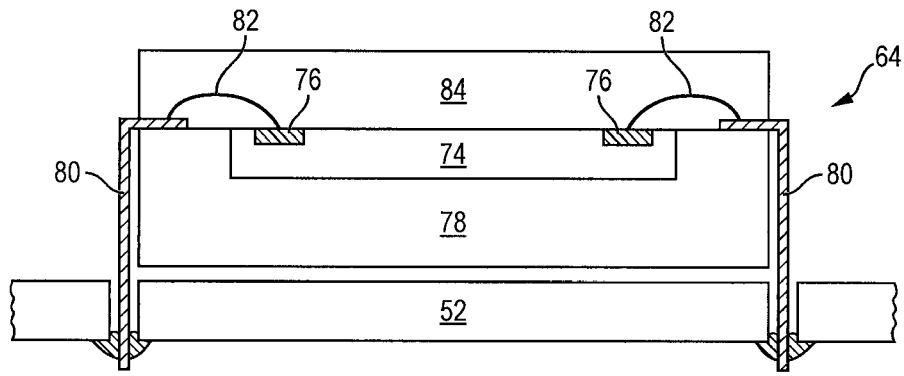
FIGS. 2a-2c illustrate further detail of the representative semiconductor packages mounted to the PCB.
Figure 2B:
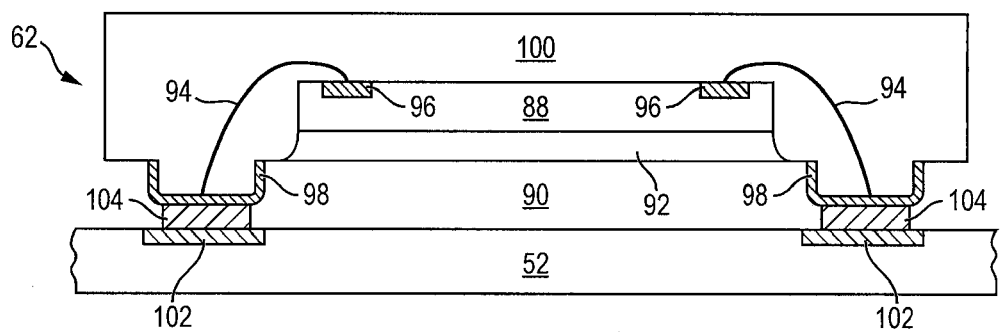
Figure 2C:
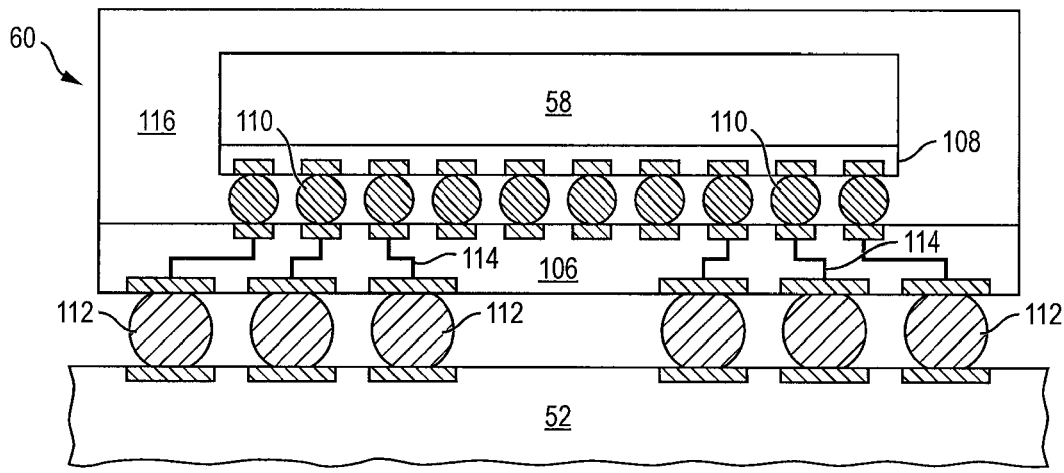

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
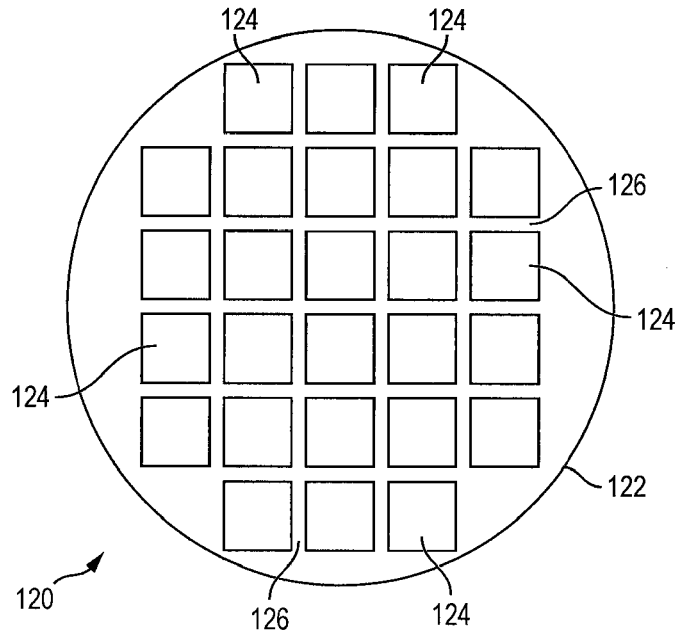
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124.

Figure 3B:
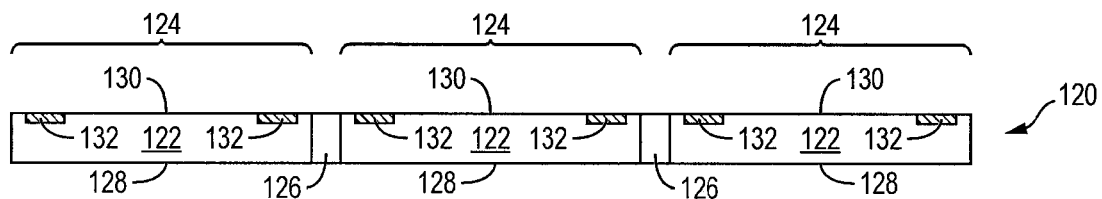

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a wire bond type die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
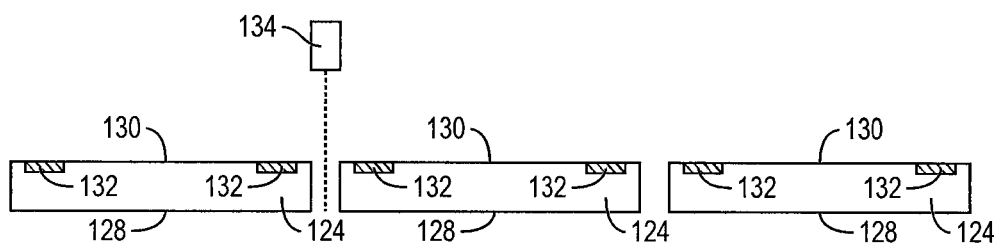

In FIG. 3c, semiconductor wafer 120 is singulated through saw street 126 using a saw blade or laser cutting tool 134 into individual semiconductor die 124.

Figure 4E:
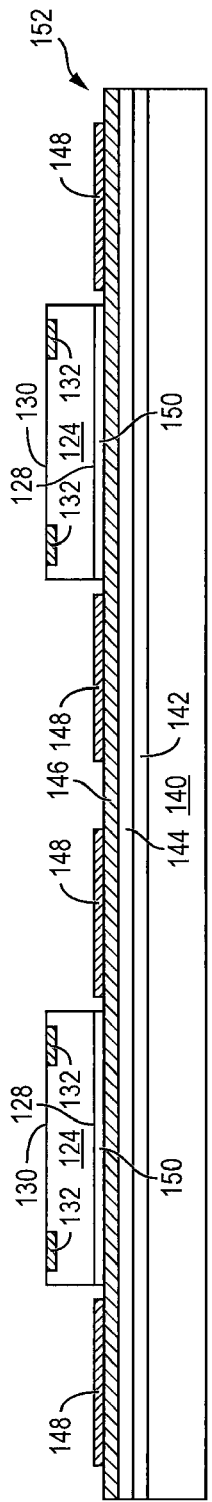

FIGS. 4a-4l illustrate, in relation to FIGS. 1 and 2a-2c, a process of forming a semiconductor package with a conductive layer extending to the die mounting site to minimize bond wire span. In FIG. 4a, a temporary substrate or carrier 140 contains sacrificial base material such as silicon, polymer, beryllium oxide, glass, or other suitable low-cost, rigid material for structural support. Carrier 140 can be round or rectangular in shape. An interface layer or double-sided tape 142 is formed over carrier 140 as a temporary adhesive bonding film, etch-stop layer, or release layer.

An insulating or dielectric layer 144 is formed over interface layer 142 using PVD, CVD, screen printing, spin coating, spray coating, dispensing, lamination, sintering or thermal oxidation. The insulating layer 144 contains one or more layers of silicon dioxide (SiO2), silicon nitride (Si3N4), silicon oxynitride (SiON), tantalum pentoxide (Ta2O5), aluminum oxide (Al2O3), benzocyclobutene (BCB), polyimide (PI), polybenzoxazoles (PBO), polymer, polymer composite, or other suitable dielectric material. In one embodiment, insulating layer 144 is an RCC tape or photosensitive dry film.

In FIG. 4b, an electrically conductive layer 146 is formed over insulating layer 144 using a patterning and metal deposition process such as sputtering, lamination, electrolytic plating, and electroless plating. Conductive layer 146 can be one or more layers of Al, Cu, Sn, Ni, Au, Ag, or other suitable electrically conductive material. In one embodiment, conductive layer 146 is a Cu foil laminated to insulating layer 144. Conductive layer 146 operates as a plating seed layer.

In FIG. 4c, an electrically conductive layer 148 is formed over conductive layer 146 using a patterning and metal deposition process such as sputtering, electrolytic plating, and electroless plating. Conductive layer 148 can be one or more layers of Al, Cu, Sn, Ni, Au, Ag, or other suitable electrically conductive material. Conductive layer 148 is formed in a plurality of electrically isolated segments, each electrically connected to conductive layer 146. Other portions of conductive layer 148 can be electrically common or electrically isolated depending on the design and function of semiconductor die 124.

In FIG. 4d, semiconductor die 124 from FIGS. 3a-3c is mounted to conductive layer 146 with die attach adhesive 150, such as epoxy resin, using a pick and place operation with back surface 128 oriented toward carrier 140. FIG. 4e shows semiconductor die 124 mounted to conductive layer 146 as a panel form carrier 152. The insulating layer 144 can be an encapsulant material or molding compound to maintain coplanarity of panel form carrier 152. Conductive layer 148 is disposed substantially at a level of back surface 128 of semiconductor die 124.

Figure 4F:
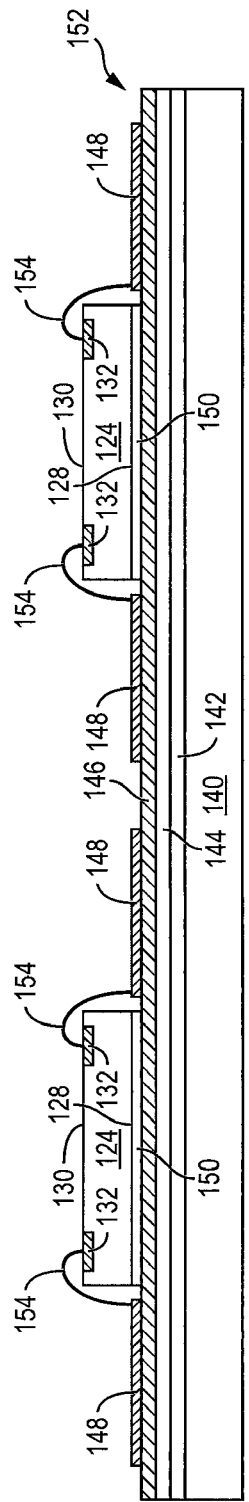

In FIG. 4f, a plurality of bond wires 154 is formed between conductive layer 132 of semiconductor die 124 and conductive layer 148. In one embodiment, bond wires 154 are Cu. Conductive layer 148 extends to the mounting sites of semiconductor die 124 to minimize the span of the bond wires.

Figure 4G:
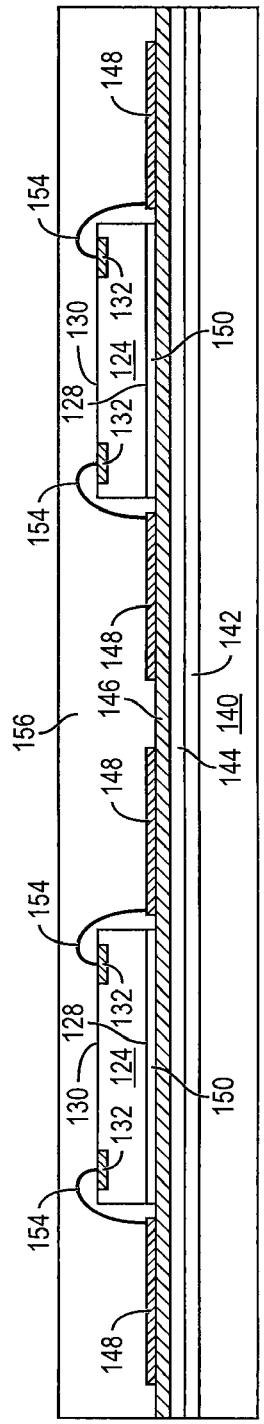

In FIG. 4g, an encapsulant or molding compound 156 is deposited over semiconductor die 124, conductive layers 146 and 148, and bond wires 154 using a paste printing, compressive molding, transfer molding, liquid encapsulant molding, vacuum lamination, spin coating, or other suitable applicator. Encapsulant 156 can be polymer composite material, such as epoxy resin with filler, epoxy acrylate with filler, or polymer with proper filler. Encapsulant 156 is non-conductive and environmentally protects the semiconductor device from external elements and contaminants. An optional encapsulant or molding compound 157 is deposited over encapsulant 156 to reduce warpage, as shown in FIG. 4h.

Continuing from FIG. 4g, carrier 140 and interface layer 142 are removed by chemical etching, mechanical peeling, CMP, mechanical grinding, thermal bake, UV light, laser scanning, or wet stripping to expose insulating layer 144, as shown in FIG. 4i. In one embodiment, carrier 140 and interface layer 142 are removed with a selective etchant with a substantially higher etch rate for interface layer 142 and substantially lower etch rate for encapsulant 156 and carrier 140. Alternatively, interface layer 142 is exposed with a light source and developed with a suitable solvent. The interface layer 142 can also be removed by exposing a deactivating agent in the material to a light source and peeling off carrier 140. The above options preserve carrier 140 for reuse.

In FIG. 4j, a portion of insulating layer 144 is removed by an etching process through a patterned photoresist layer (not shown) to expose portions of conductive layer 146 under conductive layer 148 and semiconductor die 124.

Figure 4K:
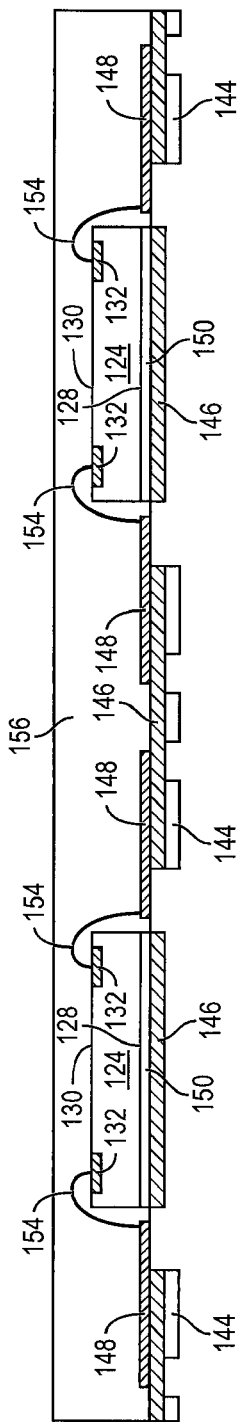

In FIG. 4k, a portion of conductive layer 146 is removed by an etching process through a patterned photoresist layer to electrically isolate the remaining portions of conductive layer 146 under conductive layer 148 and semiconductor die 124. The portion of conductive layer 146 under semiconductor die 124 operates as a thermal paddle or heat spreader to dissipate heat from the semiconductor die.

Figure 4L:
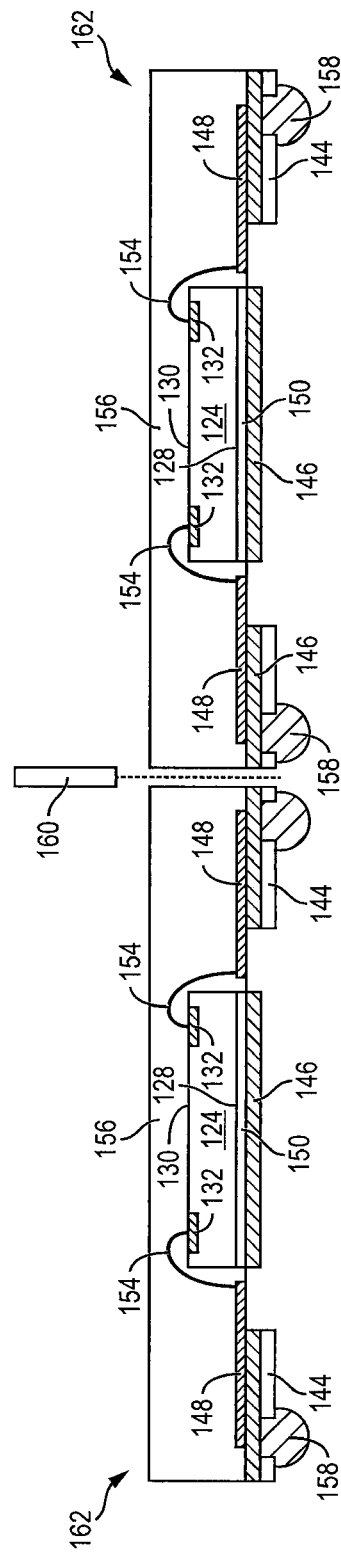

In FIG. 4l, an optional bump or conductive paste 158 can be formed over the exposed conductive layer 146 for external interconnect. The panel form carrier 152 is singulated through encapsulant 156, insulating layer 144, and conductive layer 146 with saw blade or laser cutting tool 160 into individual semiconductor packages 162.

Figure 5:
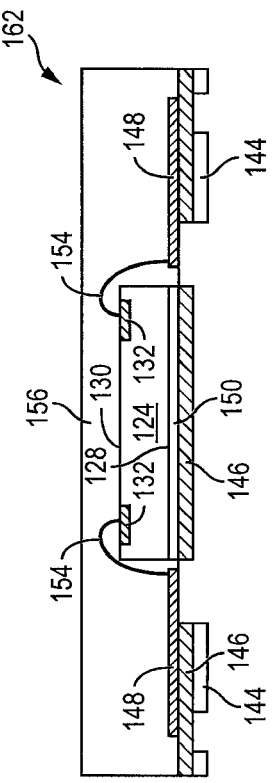
FIG. 5 illustrates the semiconductor package with the conductive layer extending to the die mounting site to minimize bond wire span according to FIGS. 4a-4l.

FIG. 5 shows semiconductor package after singulation. Semiconductor die 124 is electrically connected through bond wires 154 to conductive layers 146 and 148. Semiconductor package 162 is fabricated as a panel form carrier for mass production and lower manufacturing cost. The panel form carrier can be panel form carrier can be circular or rectangular in shape. Conductive layer 148 extends up to the die mounting sites of semiconductor die 124 to minimize the span of bond wires 154. Conductive layer 146 serves as a seed layer for external connection to conductive layer 148. Conductive layers 146 and 148 and bond wires 154 provide a relatively short and low resistance signal path to conductive layer 132 of semiconductor die 124. Alternatively, bumps or conductive paste 158 can be formed over conductive layer 146. Semiconductor package 162 has a thin profile by nature of conductive layer 148 being disposed substantially at the level of back surface 128 of semiconductor die 124. An optional encapsulant or molding compound can be deposited over encapsulant 156 to reduce warpage. Semiconductor package 162 is applicable to fan—in and fan-out ball array packages, such as QFNst or QFNmr.

Figure 6A:
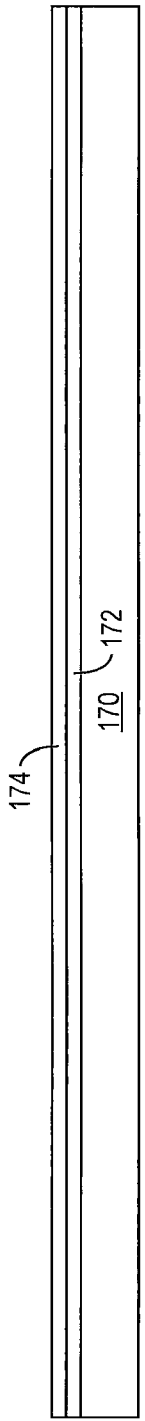

FIGS. 6a-6j illustrate, in relation to FIGS. 1 and 2a-2c, another process of forming a semiconductor package with a conductive layer extending to the die mounting site to minimize bond wire span. In FIG. 6a, a temporary substrate or carrier 170 contains sacrificial base material such as silicon, polymer, beryllium oxide, glass, or other suitable low-cost, rigid material for structural support. Carrier 170 can be round or rectangular in shape. An interface layer or double-sided tape 172 is formed over carrier 170 as a temporary adhesive bonding film, etch-stop layer, or release layer.

An insulating or dielectric layer 174 is formed over interface layer 172 using PVD, CVD, screen printing, spin coating, spray coating, dispensing, lamination, sintering or thermal oxidation. The insulating layer 174 contains one or more layers of SiO2, Si3N4, SiON, Ta2O5, Al2O3, BCB, PI, PBO, polymer, polymer composite, or other suitable dielectric material. In one embodiment, insulating layer 174 is an RCC tape or photosensitive dry film.

Figure 6B:
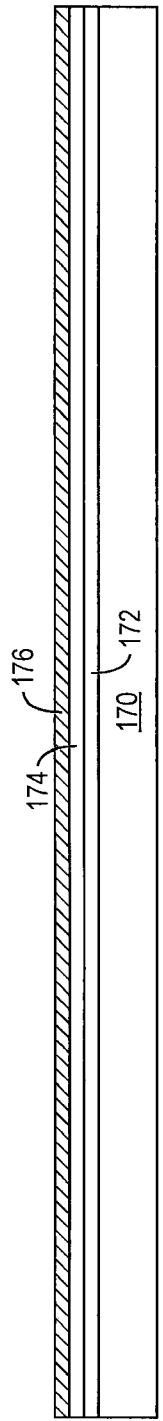

In FIG. 6b, an electrically conductive layer 176 is formed over insulating layer 174 using a patterning and metal deposition process such as sputtering, lamination, electrolytic plating, and electroless plating. Conductive layer 176 can be one or more layers of Al, Cu, Sn, Ni, Au, Ag, or other suitable electrically conductive material. In one embodiment, conductive layer 176 is a Cu foil laminated to insulating layer 174. Conductive layer 176 operates as a plating seed layer.

Figure 6C:
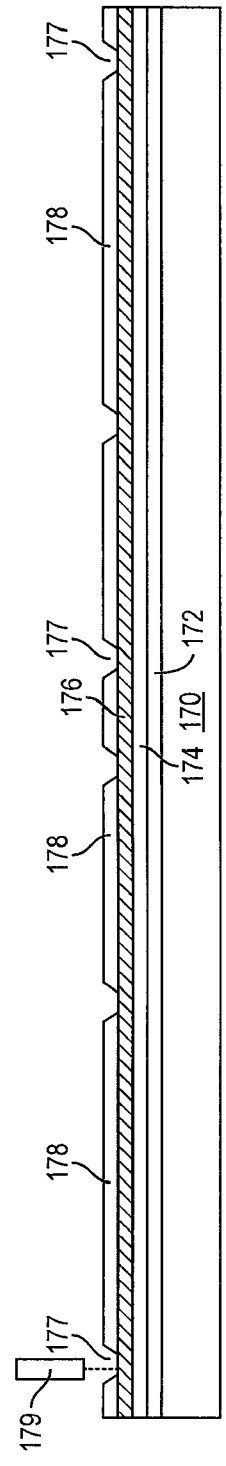

In FIG. 6c, an insulating or passivation layer 178 is formed over conductive layer 176 using PVD, CVD, screen printing, spin coating, spray coating, dispensing, lamination, sintering or thermal oxidation. The insulating layer 178 contains one or more layers of SiO2, Si3N4, SiON, Ta2O5, Al2O3, or other suitable material having similar insulating and structural properties. A portion of insulating layer 178 is removed by laser drilling, mechanical drilling, or wet/dry etching process through a patterned photoresist layer to expose conductive layer 176. In one embodiment, vias 177 are formed by laser direct ablation (LDA) using laser 179.

Figure 6D:
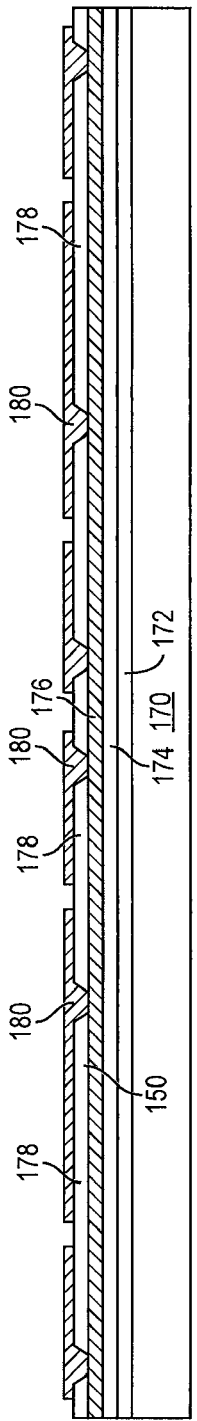

In FIG. 6d, an electrically conductive layer 180 is formed over insulating layer 178 and conductive layer 176, and into vias 177, using a patterning and metal deposition process such as sputtering, electrolytic plating, and electroless plating. Conductive layer 180 can be one or more layers of Al, Cu, Sn, Ni, Au, Ag, or other suitable electrically conductive material. Conductive layer 180 is formed in a plurality of electrically isolated segments, each electrically connected to conductive layer 176. Other portions of conductive layer 180 can be electrically common or electrically isolated depending on the design and function of semiconductor die 124.

Figure 6E:
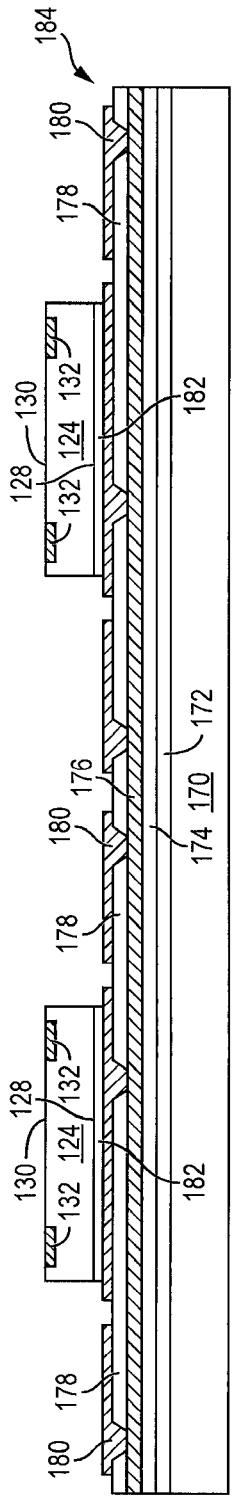

In FIG. 6e, semiconductor die 124 from FIGS. 3a-3c is mounted to conductive layer 180 with die attach adhesive 182, such as epoxy resin, using a pick and place operation with back surface 128 oriented toward carrier 170. Semiconductor die 124 mounted to carrier 170 are shown as panel form carrier 184. The insulating layer 174 can be an encapsulant material or molding compound to maintain coplanarity of panel form carrier 184.

Figure 6F:
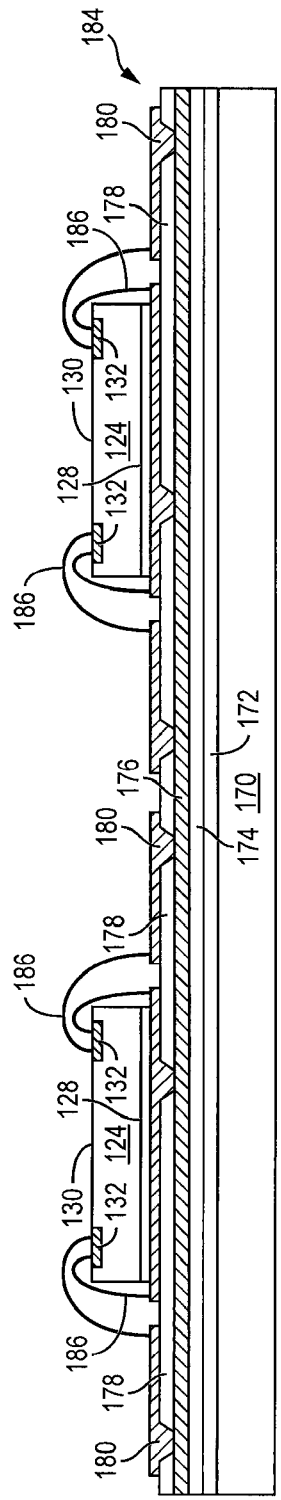

In FIG. 6f, a plurality of bond wires 186 is formed between conductive layer 132 of semiconductor die 124 and conductive layer 180. In one embodiment, bond wires 186 are Cu. Conductive layer 180 extends to the mounting sites of semiconductor die 124 to minimize the span of the bond wires.

Figure 6G:
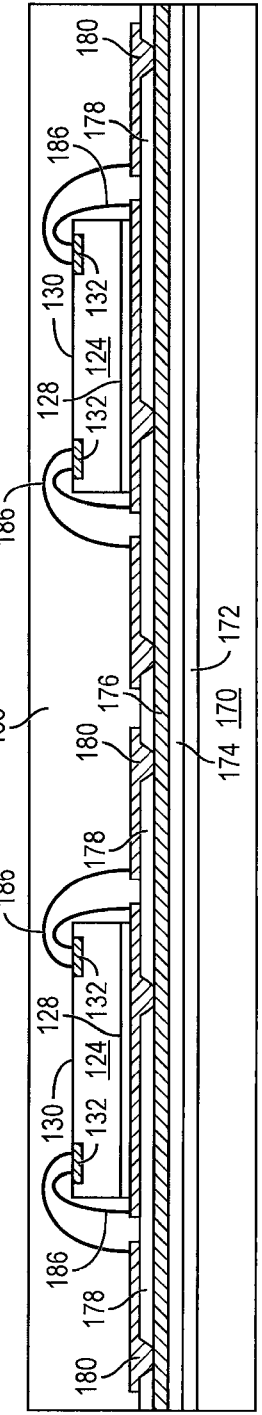

In FIG. 6g, an encapsulant or molding compound 188 is deposited over semiconductor die 124, insulating layer 178, conductive layer 180, and bond wires 186 using a paste printing, compressive molding, transfer molding, liquid encapsulant molding, vacuum lamination, spin coating, or other suitable applicator. Encapsulant 188 can be polymer composite material, such as epoxy resin with filler, epoxy acrylate with filler, or polymer with proper filler. Encapsulant 188 is non-conductive and environmentally protects the semiconductor device from external elements and contaminants. An optional second encapsulant or molding compound can be deposited over encapsulant 188 to reduce warpage, similar to FIG. 4h.

In FIG. 6h, carrier 170 and interface layer 172 are removed by chemical etching, mechanical peeling, CMP, mechanical grinding, thermal bake, UV light, laser scanning, or wet stripping to expose insulating layer 174. In one embodiment, carrier 170 and interface layer 172 are removed with a selective etchant with a substantially higher etch rate for interface layer 172 and substantially lower etch rate for encapsulant 188 and carrier 170. Alternatively, interface layer 172 is exposed with a light source and developed with a suitable solvent. The interface layer 172 can also be removed by exposing a deactivating agent in the material to a light source and peeling off carrier 170. The above options preserve carrier 170 for reuse. A portion of insulating layer 174 is removed by an etching process through a patterned photoresist layer to expose portions of conductive layer 176 under conductive layer 180 and semiconductor die 124.

In FIG. 6i, a portion of conductive layer 176 is removed by an etching process through a patterned photoresist layer to electrically isolate the remaining portions of conductive layer 176 under conductive layer 180 and semiconductor die 124.

In FIG. 6j, an optional bump or conductive paste 189 can be formed over the exposed conductive layer 146 for external interconnect. The panel form carrier 184 is singulated through encapsulant 188, insulating layers 174 and 178, and conductive layer 176 and 180 with saw blade or laser cutting tool 190 into individual semiconductor packages 192.

Figure 7:
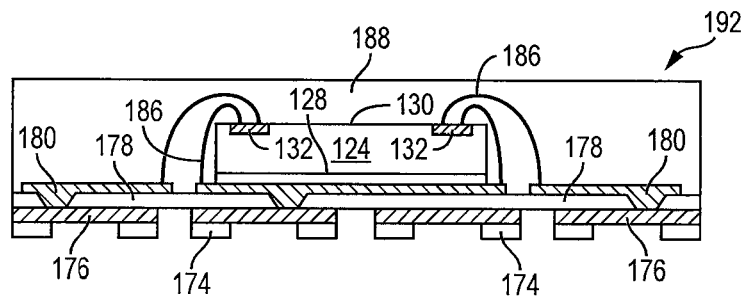
FIG. 7 illustrates the semiconductor package with the conductive layer extending to the die mounting site to minimize bond wire span according to FIGS. 6a-6j.

FIG. 7 shows semiconductor package 192 after singulation. Semiconductor die 124 is electrically connected through bond wires 186 to conductive layers 176 and 180. Semiconductor package 192 is fabricated as a panel form carrier for mass production and lower manufacturing cost. The panel form carrier can be panel form carrier can be circular or rectangular in shape. Conductive layer 180 extends up to the die mounting sites of semiconductor die 124 to minimize the span of bond wires 186. Conductive layer 176 serves as a seed layer for external connection to conductive layer 180. Alternatively, bumps or conductive paste 189 can be formed over conductive layer 176. Conductive layers 176 and 180 and bond wires 186 provide a relatively short and low resistance signal path to conductive layer 132 of semiconductor die 124. Semiconductor package 192 has a thin profile by nature of conductive layer 180 being disposed substantially at the level of back surface 128 of semiconductor die 124. An optional encapsulant or molding compound can be deposited over encapsulant 188 to reduce warpage. Semiconductor package 192 is applicable to fan-in and fan-out ball array packages, such as QFNst or QFNmr.

Figure 8:
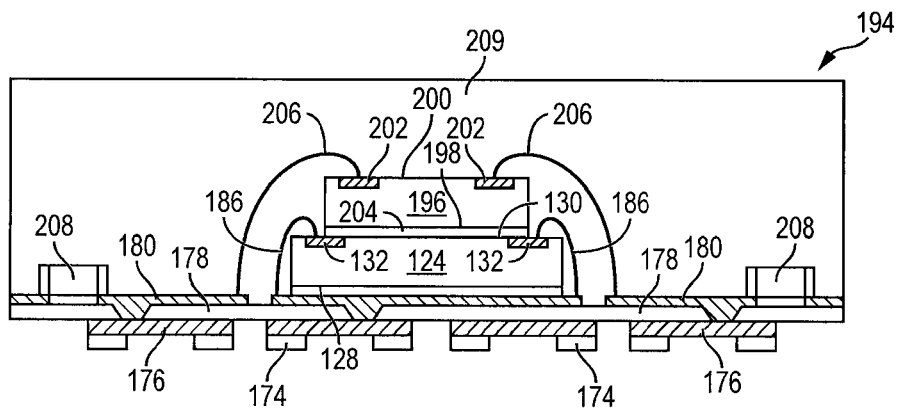
FIG. 8 illustrates two stacked wire bond die in a semiconductor package with the conductive layer extending to a die mounting site to minimize bond wire span.

FIG. 8 shows an embodiment of semiconductor package 194, similar to FIG. 7, with stacked semiconductor die and discrete active or passive devices embedded within an encapsulant. Semiconductor die 196 originating from a semiconductor wafer, similar to FIGS. 3a-3c, has a back surface 198 and active surface 200 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 200 to implement analog circuits or digital circuits, such as DSP, ASIC, memory, or other signal processing circuit. Semiconductor die 196 may also contain IPDs, such as inductors, capacitors, and resistors, for RF signal processing. A plurality of contact pads 202 is formed on active surface 200 and electrically connected to the circuits on the active surface. In one embodiment, semiconductor die 196 is a wire bond type die.

Semiconductor die 196 is mounted back surface 198 to active surface 130 of semiconductor die 124 with die attach adhesive 204, such as epoxy resin, prior to depositing encapsulant 188. Bond wires 186 are formed between conductive layer 132 on active surface 130 of semiconductor die 124 and conductive layer 180. Bond wires 206 are formed between contact pads 202 on active surface 200 of semiconductor die 196 and conductive layer 180.

Discrete devices 208 are mounted to conductive layer 180. Discrete devices 208 can be resistors, capacitors, inductor, transistors, and diodes. Discrete devices 208 are electrically connected to conductive layer 180. Encapsulant 209 is deposited over semiconductor die 124 and 196, discrete devices 208, bond wires 186 and 206, insulating layer 178, and conductive layer 180.

Figure 9:
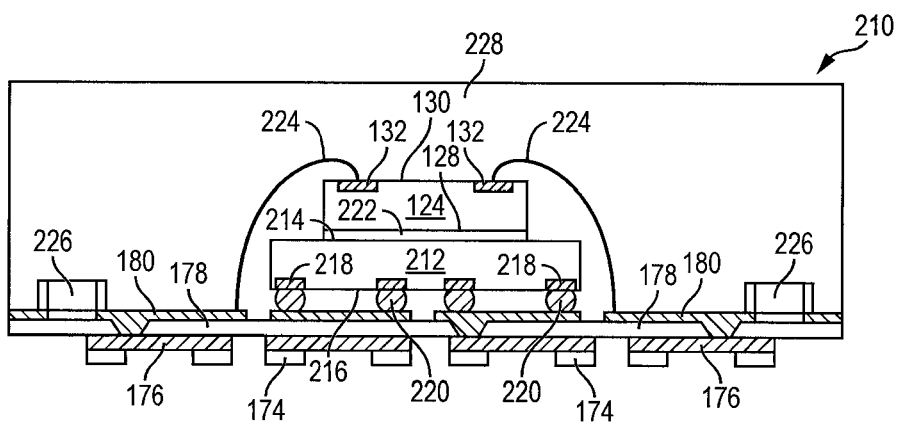
FIG. 9 illustrates a wire bond die stacked over a flipchip die in a semiconductor package with the conductive layer extending to a die mounting site to minimize bond wire span.

FIG. 9 shows an embodiment of semiconductor package 210, similar to FIG. 7, with stacked semiconductor die and discrete active or passive devices embedded within an encapsulant. Semiconductor die 212 originating from a semiconductor wafer, similar to FIGS. 3a-3c, has a back surface 214 and active surface 216 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 216 to implement analog circuits or digital circuits, such as DSP, ASIC, memory, or other signal processing circuit. Semiconductor die 212 may also contain IPDs, such as inductors, capacitors, and resistors, for RF signal processing. A plurality of contact pads 218 is formed on active surface 216 and electrically connected to the circuits on the active surface. A plurality of bumps 220 is formed over contact pads 218. In one embodiment, semiconductor die 212 is a flipchip type die.

Semiconductor die 212 is mounted active surface 214 oriented toward conductive layer 180, prior to mounting semiconductor die 124 and depositing the encapsulant. Bumps 220 are reflowed to metallurgically and electrically connect semiconductor die 212 to conductive layer 180. Semiconductor die 124 is mounted back surface 128 to back surface 214 of semiconductor die 212 with die attach adhesive 222, such as epoxy resin. Bond wires 224 are formed between conductive layer 132 on active surface 130 of semiconductor die 124 and conductive layer 180.

Discrete devices 226 are mounted to conductive layer 180. Discrete devices 226 can be resistors, capacitors, inductor, transistors, and diodes. Discrete devices 226 are electrically connected to conductive layer 180. Encapsulant 228 is deposited over semiconductor die 124 and 212, discrete devices 226, bond wires 224, insulating layer 178, and conductive layer 180.

Figure 10A:
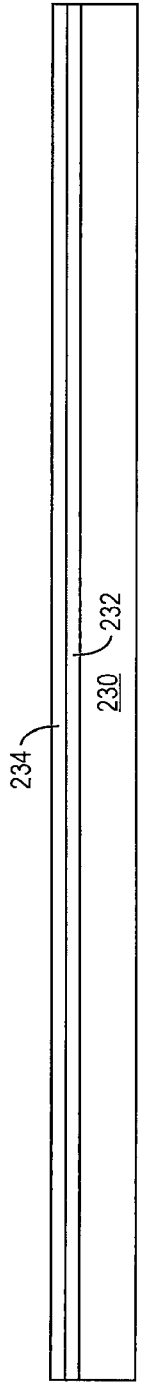

FIGS. 10a-10h illustrate, in relation to FIGS. 1 and 2a-2c, another process of forming a semiconductor package with a conductive layer extending to the die mounting site to minimize bond wire span. In FIG. 10a, a temporary substrate or carrier 230 contains sacrificial base material such as silicon, polymer, beryllium oxide, glass, or other suitable low-cost, rigid material for structural support. Carrier 230 can be round or rectangular in shape. An interface layer or double-sided tape 232 is formed over carrier 230 as a temporary adhesive bonding film, etch-stop layer, or release layer.

An insulating or dielectric layer 234 is formed over interface layer 232 using PVD, CVD, screen printing, spin coating, spray coating, dispensing, lamination, sintering or thermal oxidation. The insulating layer 234 contains one or more layers of SiO2, Si3N4, SiON, Ta2O5, Al2O3, BCB, PI, PBO, polymer, polymer composite, or other suitable dielectric material. In one embodiment, insulating layer 234 is an RCC tape or photosensitive dry film.

Figure 10B:
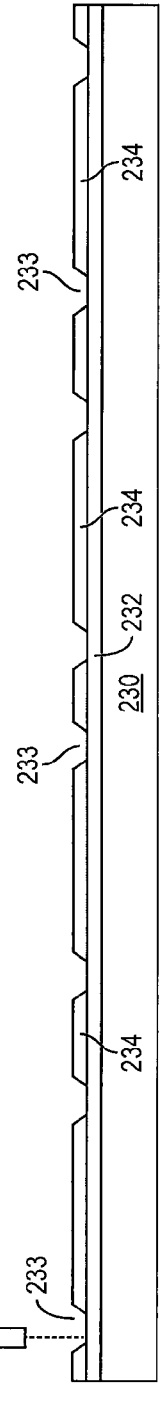

In FIG. 10b, a plurality of vias 233 is formed through insulating layer 232 using laser drilling, mechanical drilling, or wet/dry etching process through a photoresist layer to expose interface layer 232. In one embodiment, vias 233 are formed by LDA using laser 235.

Figure 10C:
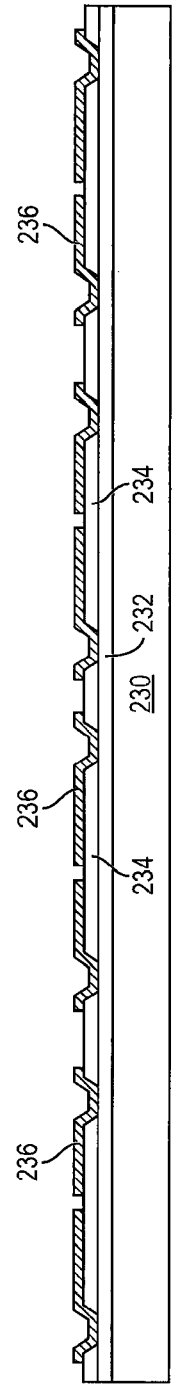

In FIG. 10c, an electrically conductive layer 236 is conformally applied to insulating layer 234 and into vias 233 using a patterning and metal deposition process such as sputtering, lamination, electrolytic plating, and electroless plating. Conductive layer 236 can be one or more layers of Al, Cu, Sn, Ni, Au, Ag, or other suitable electrically conductive material. In one embodiment, conductive layer 236 is a multi-metal stacked UBM layer with adhesion layer, barrier layer, and seed or wetting layer. The adhesion layer is formed over insulating layer 234 and can be titanium (Ti), titanium nitride (TiN), titanium tungsten (TiW), Al, or chromium (Cr). The barrier layer is formed over the adhesion layer and can be Ni, nickel vanadium (NiV), platinum (Pt), palladium (Pd), TiW, or chromium copper (CrCu). The barrier layer inhibits the diffusion of Cu into the active area of the die. The seed layer is formed over the barrier layer and can be Cu, Ni, NiV, Au, or Al. Conductive layer 236 is formed in a plurality of electrically isolated segments. Other portions of conductive layer 236 can be electrically common or electrically isolated depending on the design and function of semiconductor die 124.

Figure 10D:
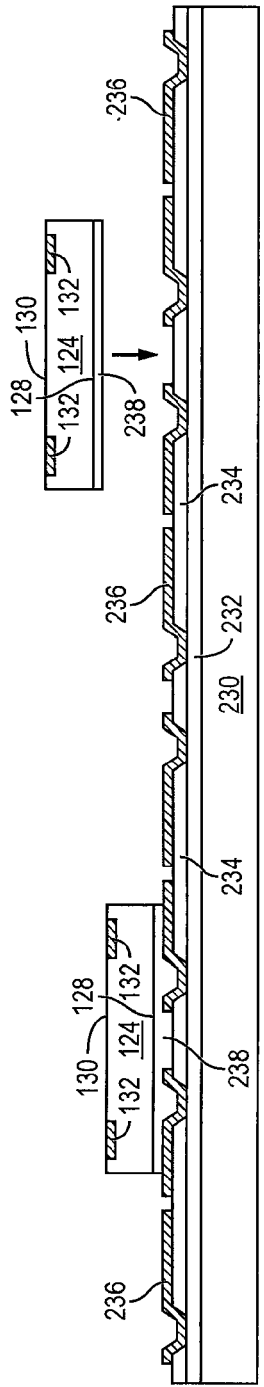
Figure 10E:
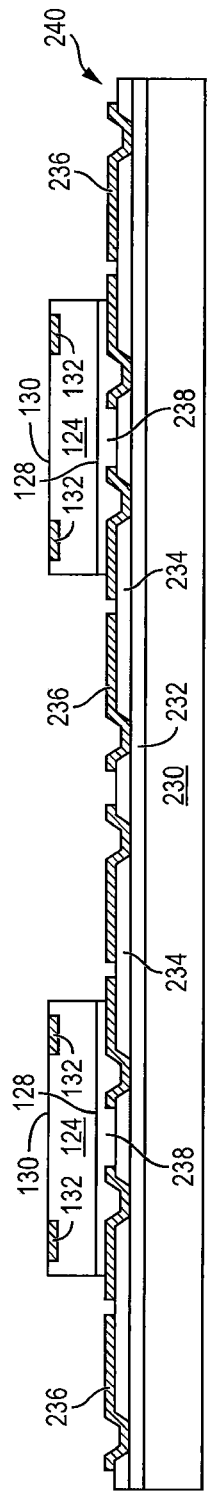

In FIG. 10d, semiconductor die 124 from FIGS. 3a-3c is mounted to conductive layer 236 with die attach adhesive 238, such as epoxy resin, using a pick and place operation with back surface 128 oriented toward carrier 230. FIG. 10e shows semiconductor die 124 mounted to conductive layer 236 as a panel form carrier 240. The insulating layer 234 can be an encapsulant material or molding compound to maintain coplanarity of panel form carrier 240.

Figure 10F:
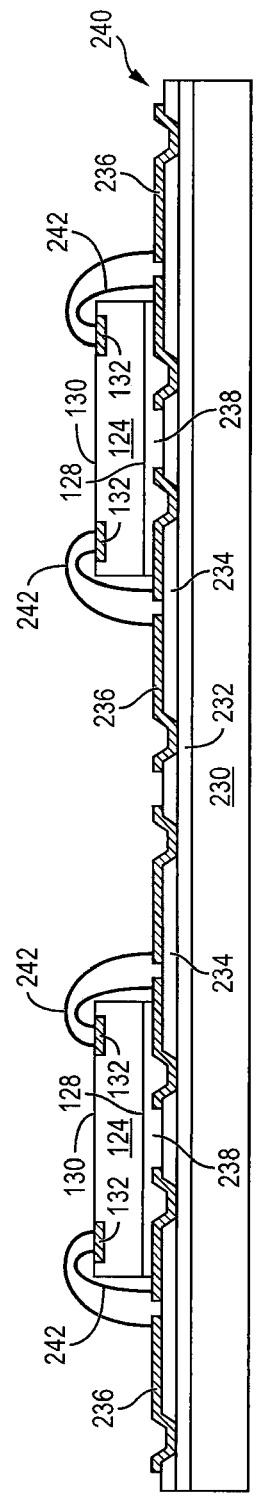

In FIG. 10f, a plurality of bond wires 242 is formed between conductive layer 132 of semiconductor die 124 and conductive layer 236. In one embodiment, bond wires 242 are Cu. Conductive layer 236 extends to the mounting sites of semiconductor die 124 to minimize the span of bond wires 242.

Figure 10G:
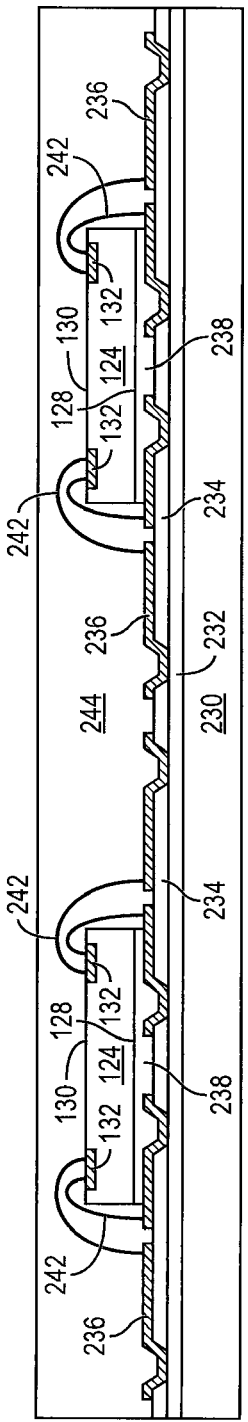

In FIG. 10g, an encapsulant or molding compound 244 is deposited over semiconductor die 124, insulating layer 234, conductive layer 236, and bond wires 242 using a paste printing, compressive molding, transfer molding, liquid encapsulant molding, vacuum lamination, spin coating, or other suitable applicator. Encapsulant 244 can be polymer composite material, such as epoxy resin with filler, epoxy acrylate with filler, or polymer with proper filler. Encapsulant 244 is non-conductive and environmentally protects the semiconductor device from external elements and contaminants. A second encapsulant or molding compound can be deposited over encapsulant 244 to reduce warpage, similar to FIG. 4h.

In FIG. 10h, carrier 230 and interface layer 232 are removed by chemical etching, mechanical peeling, CMP, mechanical grinding, thermal bake, UV light, laser scanning, or wet stripping to expose insulating layer 234 and conductive layer 236. In one embodiment, carrier 230 and interface layer 232 are removed with a selective etchant with a substantially higher etch rate for interface layer 232 and substantially lower etch rate for encapsulant 244 and carrier 230. Alternatively, interface layer 232 is exposed with a light source and developed with a suitable solvent. The interface layer 232 can also be removed by exposing a deactivating agent in the material to a light source and peeling off carrier 230. The above options preserve carrier 230 for reuse.

The exposed conductive layer 236 provides external interconnect. A wetting layer of NiPdAu or solder paste can be deposited over the exposed conductive layer 236 to enhance adhesion in board level surface mount applications.

In FIG. 10h, the panel form carrier 240 is singulated through encapsulant 244, insulating layer 234, and conductive layer 236 with saw blade or laser cutting tool 246 into individual semiconductor packages 248.

FIG. 11 shows semiconductor package 248 after singulation. Semiconductor die 124 is electrically connected through bond wires 242 to conductive layer 236. Semiconductor package 248 is fabricated as a panel form carrier for mass production and lower manufacturing cost. The panel form carrier can be panel form carrier can be circular or rectangular in shape. Conductive layer 236 extends up to the die mounting sites of semiconductor die 124 to minimize the span of bond wires 242. Conductive layer 236 and bond wires 242 provide a relatively short and low resistance signal path to conductive layer 132 of semiconductor die 124. Semiconductor package 248 has a thin profile by nature of conductive layer 236 being disposed substantially at the level of back surface 128 of semiconductor die 124. An optional encapsulant or molding compound can be deposited over encapsulant 244 to reduce warpage. Semiconductor package 248 is applicable to fan-in and fan-out ball array packages, such as QFNst or QFNmr.

Figure 12:
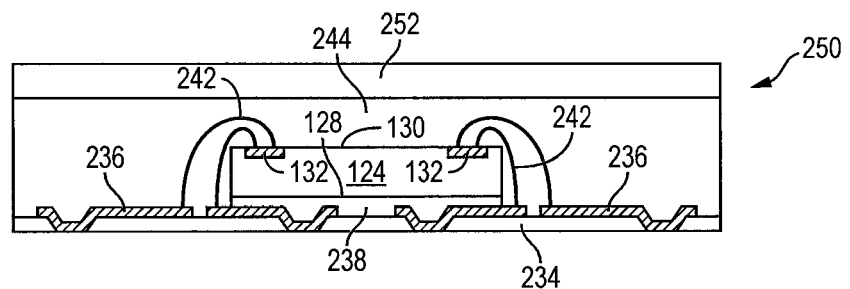
FIG. 12 illustrates a second encapsulant deposited over the first encapsulant of a semiconductor package.

FIG. 12 shows an embodiment of semiconductor package 250, similar to FIG. 11, with a second encapsulant or molding compound 252 deposited over encapsulant 244 to reduce warpage. Encapsulant 252 is deposited over encapsulant 244 using a paste printing, compressive molding, transfer molding, liquid encapsulant molding, vacuum lamination, spin coating, or other suitable applicator. Encapsulant 252 can be polymer composite material, such as epoxy resin with filler, epoxy acrylate with filler, or polymer with proper filler.

Figure 13:
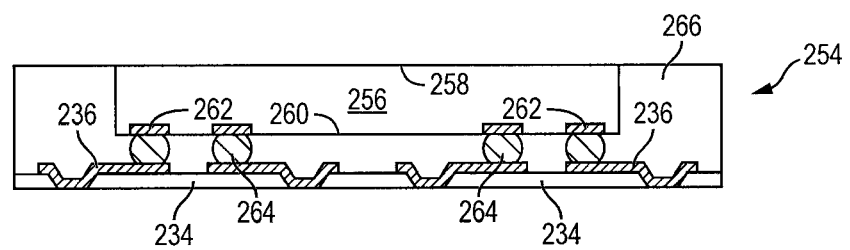
FIG. 13 illustrates a flipchip die mounted to a conductive layer in a semiconductor package.

FIG. 13 shows an embodiment of semiconductor package 254, similar to FIG. 11, with a flipchip type semiconductor die 256 mounted to conductive layer 236 prior to depositing an encapsulant. Semiconductor die 256 originating from a semiconductor wafer, similar to FIGS. 3a-3c, has a back surface 258 and active surface 260 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 260 to implement analog circuits or digital circuits, such as DSP, ASIC, memory, or other signal processing circuit. Semiconductor die 256 may also contain IPDs, such as inductors, capacitors, and resistors, for RF signal processing. A plurality of contact pads 262 is formed on active surface 200 and electrically connected to the circuits on the active surface. A plurality of bumps 264 is formed over contact pads 262.

Semiconductor die 256 is mounted to conductive layer 236, prior to depositing the encapsulant. Bumps 264 are reflowed to metallurgically and electrically connect semiconductor die 256 to conductive layer 236. In one embodiment, bumps 264 are electrically connected to conductive layer 236 with bump on trace arrangement, i.e., the bumps are reflowed to narrower linear portions of the conductive layer. Encapsulant 266 is deposited over semiconductor die 256 and conductive layer 236. A portion of encapsulant 266 can be removed by an etching process or back grinding process to expose back surface 258 of semiconductor die 256.

Figure 14:
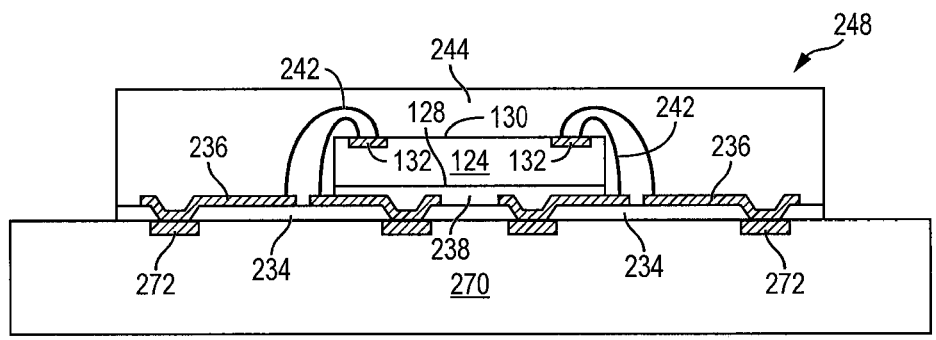
FIG. 14 illustrates the semiconductor package mounted to a substrate in a surface mount application.

FIG. 14 shows semiconductor package 248 of FIG. 11 mounted to substrate 270. The exposed conductive layer 236 is metallurgically and electrically connected to conductive traces 272 on substrate 270 in a board level surface mount application.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing an insulating layer;
   forming a first conductive layer over the insulating layer;
   forming a second conductive layer over a first surface of the first conductive layer extending from a peripheral region of the semiconductor device to a die mounting site;
   disposing a first semiconductor die over the first surface of the first conductive layer at the die mounting site;
   forming a bond wire between a contact pad on the first semiconductor die and the second conductive layer;
   depositing a first encapsulant over the first semiconductor die;
   forming an opening in the insulating layer over a second surface of the first conductive layer opposite the first surface of the first conductive layer; and
   removing a portion of the first conductive layer within the opening in the insulating layer.

2. The method of claim 1, wherein a portion of the second conductive layer extends over the first semiconductor die.

3. The method of claim 1, further including depositing a second encapsulant over the first encapsulant.

4. The method of claim 1, further including retaining a portion of the first conductive layer over the semiconductor die for heat dissipation.

5. The method of claim 1, further including disposing a second semiconductor die over the first semiconductor die prior to depositing the first encapsulant.

6. The method of claim 1, further including disposing a discrete device over the second conductive layer prior to depositing the first encapsulant.

7. A method of making a semiconductor device, comprising:
   forming a first insulating layer;
   forming a first conductive layer over the first insulating layer;
   disposing a first semiconductor die over the first conductive layer;
   depositing an encapsulant over the first semiconductor die;
   forming an opening in the first insulating layer over the first conductive layer; and
   removing a portion of the first conductive layer within the opening in the first insulating layer.

8. The method of claim 7, further including:
   forming a second insulating layer over the first conductive layer;
   forming a plurality of vias through the second insulating layer; and
   forming a second conductive layer over the second insulating layer and extending into the vias.

9. The method of claim 8, wherein the second conductive layer extends to a mounting site of the first semiconductor die.

10. The method of claim 7, further including disposing a second semiconductor die over the first semiconductor die prior to depositing the encapsulant.

11. The method of claim 7, further including:
   forming a second conductive layer over the first insulating layer;
   disposing a second semiconductor die over the first semiconductor die prior to depositing the encapsulant; and
   forming a bond wire between contact pads on the second semiconductor die and the second conductive layer.

12. The method of claim 7, further including disposing a second semiconductor die over the first semiconductor die.

13. The method of claim 7, further including:
   forming a second conductive layer over the first insulating layer; and
   disposing a discrete device over the second conductive layer prior to depositing the encapsulant.

14. A method of making a semiconductor device, comprising:
   forming a first conductive layer;
   forming an insulating layer over the first conductive layer;
   forming a plurality of vias through the insulating layer;
   forming a second conductive layer over the insulating layer and extending into the vias to the first conductive layer;
   disposing a first semiconductor die over the first conductive layer including a contact pad of the first semiconductor die electrically connected to the second conductive layer; and
   removing a portion of the first conductive layer to separate a first segment of the first conductive layer from a second segment of the first conductive layer after forming the insulating layer.

15. The method of claim 14, further including forming a bond wire between the contact pad of the first semiconductor die and the second conductive layer.

16. The method of claim 14, further including forming a bump over the contact pad of the first semiconductor die to electrically connect the first semiconductor die to the second conductive layer.

17. The method of claim 14, further including depositing an encapsulant over the first semiconductor die.

18. The method of claim 17, further including disposing a second semiconductor die over the first semiconductor die prior to depositing the encapsulant.

19. The method of claim 18, further including forming a bond wire between contact pads on the second semiconductor die and the second conductive layer.

20. The method of claim 17, further including disposing a discrete device over the second conductive layer prior to depositing the encapsulant.

21. A method of making a semiconductor device, comprising:
   providing a first conductive layer;
   forming a second conductive layer over the first conductive layer extending from a peripheral region of the semiconductor device to a die mounting site; and
   disposing a first semiconductor die over a first surface of the first conductive layer at the die mounting site including a contact pad of the first semiconductor die electrically connected to the first conductive layer.

22. The method of claim 21, further including:
   forming an insulating layer including a plurality of vias; and
   forming the second conductive layer over the insulating layer and extending into the vias.

23. The method of claim 21, further including depositing an encapsulant over the first semiconductor die.

24. The method of claim 23, further including disposing a discrete device over the first conductive layer prior to depositing the encapsulant.

25. The method of claim 21, further including disposing a second semiconductor die over the first semiconductor die.

* * * * *